United States Patent
Yoo et al.

(10) Patent No.: US 7,964,462 B2
(45) Date of Patent: Jun. 21, 2011

(54) METHOD OF MANUFACTURING SEMICONDUCTOR DEVICE

(75) Inventors: Dong-chul Yoo, Gyeonggi-do (KR); Han-mei Choi, Seoul (KR); Kwang-hee Lee, Seoul (KR); Kyong-won An, Seoul (KR); Cha-young Yoo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 161 days.

(21) Appl. No.: 12/270,033

(22) Filed: Nov. 13, 2008

(65) Prior Publication Data

US 2009/0124071 A1 May 14, 2009

(30) Foreign Application Priority Data

Nov. 13, 2007 (KR) .................. 10-2007-0115490

(51) Int. Cl.
*H01L 21/336* (2006.01)
(52) U.S. Cl. ...................... 438/261; 438/264
(58) Field of Classification Search .................. 438/261, 438/264
See application file for complete search history.

(56) References Cited

U.S. PATENT DOCUMENTS

2008/0265310 A1* 10/2008 Kim et al. .................. 257/325
2009/0039416 A1* 2/2009 Lai et al. .................. 257/325

FOREIGN PATENT DOCUMENTS

| JP | 2005-026590 | 1/2005 |
| KR | 1020050007496 A | 1/2005 |
| KR | 1020050033323 A | 4/2005 |

\* cited by examiner

*Primary Examiner* — Matthew S Smith
*Assistant Examiner* — John M Parker
(74) *Attorney, Agent, or Firm* — Myers Bigel Sibley & Sajovec PA

(57) ABSTRACT

Provided is a method of manufacturing a semiconductor device. The method includes: forming a charge storage layer on a substrate on which a gate insulating layer is formed; forming a first metal oxide layer on the charge storage layer using a first reaction source including a metal oxide layer precursor and a first oxidizing agent and changing the first metal oxide layer to a second metal oxide layer using a second reaction source including a second oxidizing agent having larger oxidizing power than the first oxidizing agent and repeating the forming of the first metal oxide layer and the changing of the first metal oxide layer to the second metal oxide layer several times to form a blocking insulating layer; and forming an electrode layer on the blocking insulating layer.

4 Claims, 10 Drawing Sheets

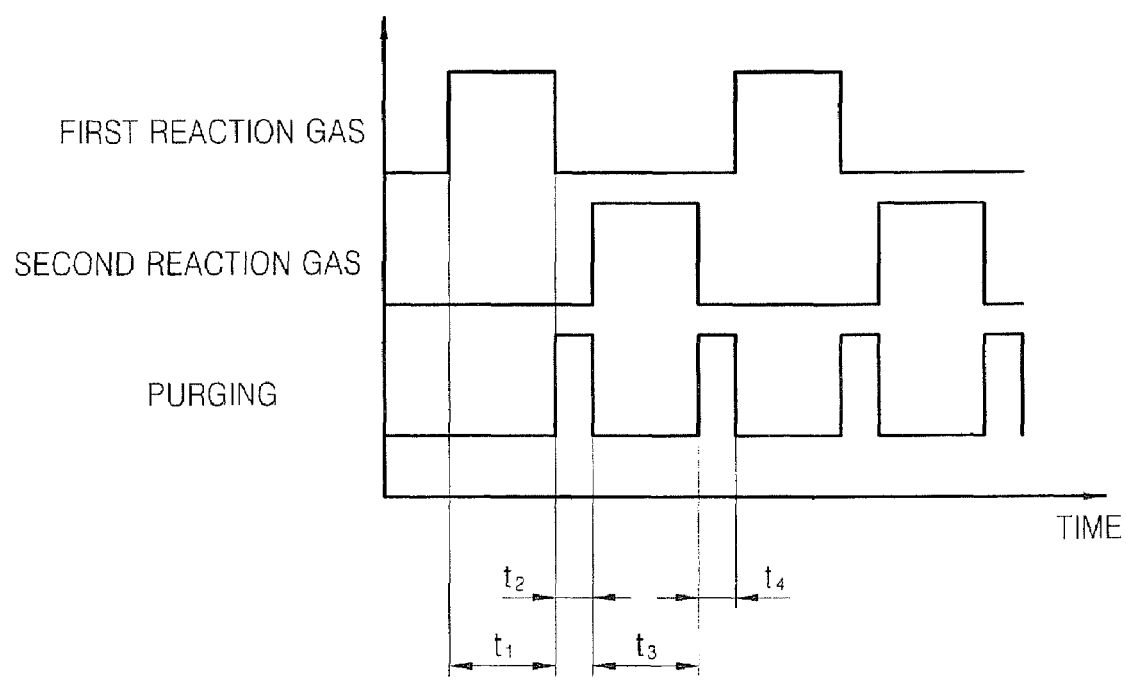

METHOD OF MANUFACTURING SEMICONDUCTOR DEVICE

CROSS-REFERENCE TO RELATED APPLICATIONS

This application claims the benefit of Korean Patent Application No. 10-2007-0115490, filed on Nov. 13, 2007, in the Korean Intellectual Property Office, the disclosure of which is incorporated herein in its entirety by reference.

BACKGROUND

The inventive concept relates to a method of manufacturing a semiconductor device, and more particularly, to a method of manufacturing a semiconductor device including a metal oxide layer.

Due to the rapid development of the electronic industry, semiconductor devices with high speed, high integration, and large capacities are being manufactured. Accordingly, conventional materials used for manufacturing semiconductor devices may not be satisfactory for required features of the semiconductor devices anymore and thus new materials are desired. However, when the new materials are applied to conventional semiconductor manufacturing processes, it may be difficult to obtain required semiconductor device characteristics due to the manufacturing conditions and the characteristics of the new materials.

SUMMARY

The inventive concept provides a semiconductor device manufacturing method including forming a metal oxide layer in which surface roughness can be reduced, the insulating characteristics can be increased, and oxidization of a lower layer can be minimized.

According to an aspect of the inventive concept, there is provided a method of manufacturing a semiconductor device comprising: forming a charge storage layer on a gate insulating layer on a substrate; forming a first metal oxide layer on the charge storage layer using a first reaction source comprising a metal oxide layer precursor and a first oxidizing agent and changing the first metal oxide layer to a second oxide layer using a second reaction source including a second oxidizing agent that has greater oxidizing power than the first oxidizing agent, and repeating the forming of the first metal oxide layer and the changing of the first metal oxide layer to the second metal oxide layer several times to form a blocking insulating layer and forming an electrode layer on the blocking insulating layer.

The first oxidizing agent may comprise carbon dioxide ($CO_2$). The second oxidizing agent may comprise oxygen ($O_2$), ozone ($O_3$), or water vapor ($H_2O$).

The charge storage layer may be formed to comprise one of a silicon nitride layer, an aluminum nitride layer, and a silicon oxy nitride layer. The charge storage layer may be formed to comprise a conductor including a doped polysilicon or a metal. The charge storage layer may be formed to have a thickness of about 20 to about 200 Å.

The first metal oxide layer may be formed in a crystallized state. The first metal oxide layer may be formed at a temperature of about 800 to about 1200° C. The first metal oxide layer may be formed to have a thickness of about 5 to about 50 Å.

The changing of the first metal oxide layer to the second metal oxide layer may be performed at a temperature of about 800 to about 1200° C.

The blocking insulating layer may be formed to comprise an oxide of hafnium (Hf), zirconium (Zr), tantalum (Ta), titanium (Ti), or an oxide of lanthanide (Ln). The precursor of the metal oxide layer may comprise aluminum tri-chloride ($AlCl_3$), and the blocking insulating layer comprises an aluminum oxide layer ($Al_2O_3$).

The blocking insulating layer may be formed to have a thickness of about 50 to about 200 Å.

The gate insulating layer may comprise one of a silicon oxide layer, a hafnium oxide layer, or a zirconium oxide layer, and a ferroelectric insulating layer. The gate insulating layer may be formed to have a thickness of about 20 to about 100 Å.

According to another aspect of the inventive concept, there is provided a method of manufacturing a semiconductor device, the method comprising: forming a first metal oxide layer on a substrate in a chamber using a first reaction source comprising a metal oxide layer precursor and a first oxidizing agent, and changing the first metal oxide layer to a second metal oxide layer using a second reaction source comprising a second oxidizing agent having larger oxidizing power than the first oxidizing agent and repeating the forming of the first metal oxide layer and the changing of the first metal oxide layer to the second metal oxide layer several times to form a metal oxide layer; and purging one of the first and second reaction sources after supplying one of the first and second reaction sources and before supplying the other subsequent first and second reaction sources.

The first oxidizing agent may comprise carbon dioxide ($CO_2$). The second oxidizing agent may comprise one of oxygen ($O_2$), ozone ($O_3$), and water vapor ($H_2O$).

The first metal oxide layer may be formed to have a thickness of about 5 to about 50 Å as the first reaction source is supplied for one time for a predetermined time.

The blocking insulating layer may be formed to comprise an oxide of hafnium (Hf), zirconium (Zr), tantalum (Ta), titanium (Ti), or aluminum (Al), or an oxide of lanthanide (Ln).

BRIEF DESCRIPTION OF THE DRAWINGS

FIG. 7 is a timing diagram showing the flow of reaction source for forming a metal oxide layer, according to a modified example of the embodiment described with respect to FIG. 6;

DETAILED DESCRIPTION OF THE EMBODIMENTS

Figure 1:
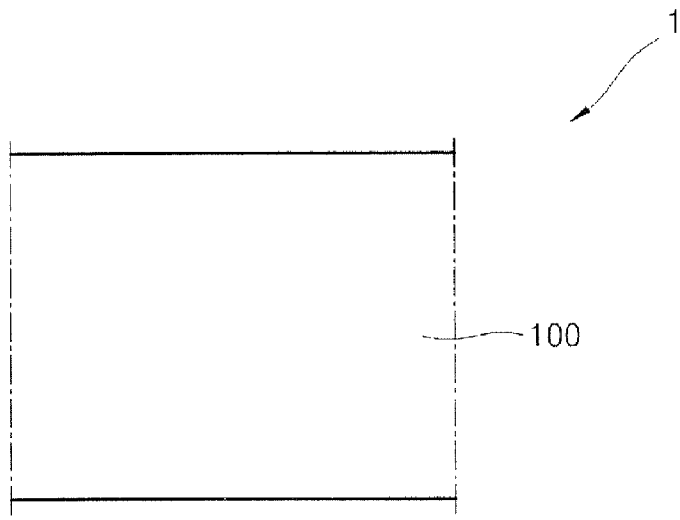
FIG. 1 is a cross-sectional view illustrating a substrate, according to an embodiment of the inventive concept.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like reference numerals designate like elements throughout the specification.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

FIGS. 1 through 6 are cross-sectional views illustrating a method of manufacturing a semiconductor device 1, according to an embodiment of the inventive concept, in the order of operations of the method.

FIG. 1 is a cross-sectional view illustrating a substrate 100 according to an embodiment of the inventive concept.

Referring to FIG. 1, the substrate 100 may be formed as a general semiconductor substrate such as a silicon substrate, the selection of which will be within the skill of one in the art. The substrate 100 may include, for example, unit elements (not shown), such as transistors, that are needed to form a semiconductor device. An interlayer insulating layer, (not shown) covering the unit elements, may be formed on a top surface of the substrate 100. Also, conductive regions (not shown), which can be electrically connected to the unit elements, may be exposed through the interlayer insulating layer on the top surface of the substrate 100. Also, conductive lines (not shown) that connect the unit elements or the conductive regions may be formed in the substrate 100.

Figure 2:
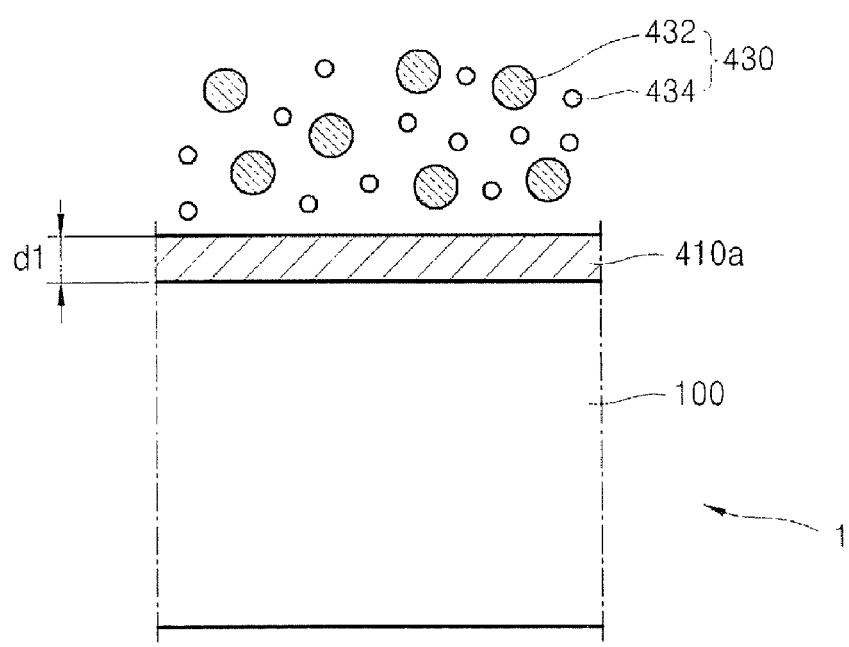
FIG. 2 is a cross-sectional view illustrating forming a first metal oxide layer, according to an embodiment of the inventive concept.

FIG. 2 is a cross-sectional view illustrating forming a first metal oxide layer 410a according to an embodiment of the inventive concept.

Referring to FIG. 2, a first reaction source 430 that includes a metal oxide layer precursor 432 and a first oxidizing agent 434 is injected in the substrate 100 to form the first metal oxide layer 410a by the reaction of the metal oxide layer precursor 432 and the first oxidizing agent 434. The first metal oxide layer 410a may be an oxide of hafnium (Hf), zirconium (Zr), tantalum (Ta), titanium (Ti), or aluminum (Al), or oxides of lanthanide (Ln). Examples of the lanthanides are lanthanum (La), cerium (Ce), praseodym (Pr), neodymium (Nd), samarium (Sm), europium (Eu), gadolinium (Gd), terbium (Tb), dysprosium (Dy), holmium (Ho), erbium (Er), tolium (Tm), ytterbium (Yb) or luthetium (Lu). The first metal oxide layer 410a may be formed using, for example, a chemical vapor deposition (CVD) method.

For example, the first metal oxide layer 410a may be an aluminum oxide layer, alumina ($Al_2O_3$), and in this case, the metal oxide layer precursor 432 may be aluminum tri-chloride ($AlCl_3$), however the first metal oxide layer 410a is not limited thereto. The first oxidizing agent 434 may preferably have low oxidizing power. For example, the first oxidizing agent 434 may be carbon dioxide ($CO_2$), and hydrogen ($H_2$) may be used together with $CO_2$, however the first oxidizing agent 434 is not limited thereto. When carbon dioxide ($CO_2$) and hydrogen ($H_2$) are used together, water molecules which are generated by the reaction of the carbon dioxide ($CO_2$) and hydrogen ($H_2$) function as an oxidizing agent, and thus has less oxidizing power than when water vapor ($H_2O$) is directly used as an oxidizing agent.

The first metal oxide layer 410a may preferably be formed at a high temperature at which the first metal oxide layer 410a can be formed in a crystallized state. Differences may be present depending on the type of the first metal oxide layer 410a, the substrate 100 below the first metal oxide layer 410a or the process conditions, however, for example, an aluminum oxide ($Al_2O_3$) layer can be formed in a crystallized state at a temperature of about 800° C., and a hafnium oxide ($HfO_2$) layer may be formed in a crystallized state at a temperature of about 900° C. Accordingly, the first metal oxide layer 410a may preferably be formed at a temperature of about 800 to about 1200° C.

Also, the first metal oxide layer 410a may preferably be formed thinner than a final metal oxide layer. The first metal oxide layer 410a may be formed to have a thickness $d_1$ of about 5 to about 50 Å for reasons that will be described in detail later below.

Figure 3:
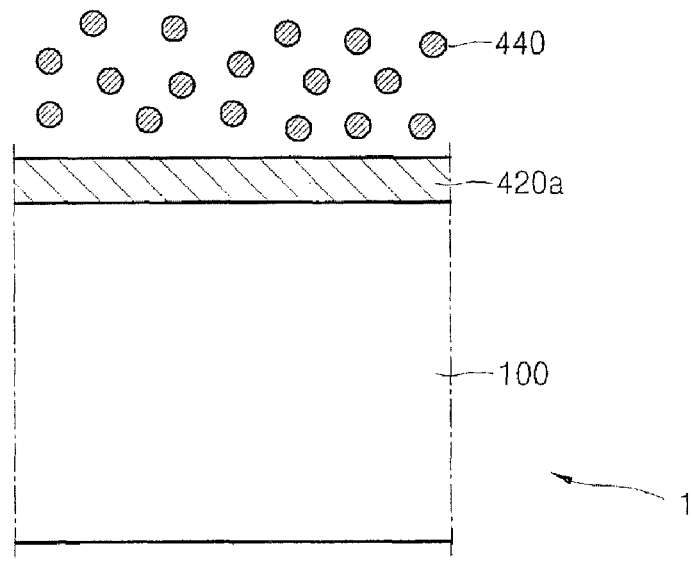
FIG. 3 is a cross-sectional view illustrating changing the first metal oxide layer to a second metal oxide layer, according to an embodiment of the inventive concept.

FIG. 3 is a cross-sectional view illustrating changing the first metal oxide layer 410a to a second metal oxide layer 420a, according to an embodiment of the inventive concept.

Referring to FIG. 3, the first metal oxide layer 410a is changed to the second metal oxide layer 420a using a second reaction source 440 including a second oxidizing agent that has greater oxidizing power than the first oxidizing agent 434. The second oxidizing agent may be, for example, oxygen ($O_2$), ozone ($O_3$), or water vapor ($H_2O$); however, the second oxidizing agent is not limited thereto.

Since the first metal oxide layer 410a which is formed using an oxidizing agent having low oxidizing power is likely to partially have metal properties, the property of the first metal oxide layer 410 as an insulating layer may be decreased. Thus, when the first metal oxide layer 410a is re-oxidized using the second oxidizing agent that has greater oxidizing power than the first metal oxidizing agent 434, the metal properties of the first metal oxide layer 410a may be minimized and its property as an insulating layer may be increased.

As described above, since the first metal oxide layer 410a is changed to the second metal oxide layer 420a, the first metal oxide layer 410a may preferably be formed to have a relatively small thickness for easy re-oxidation using the second oxidizing agent. Also, in order to minimize oxidization of the substrate 100 during re-oxidation, the thickness of the first metal oxide layer 410a and the process time for changing the first metal oxide layer 410a to the second metal oxide layer 420a may preferably be adjusted.

The process of changing the first metal oxide layer 410a to the second metal oxide layer 420a may be performed at a temperature of about 800 to about 1200° C.

Figure 4:
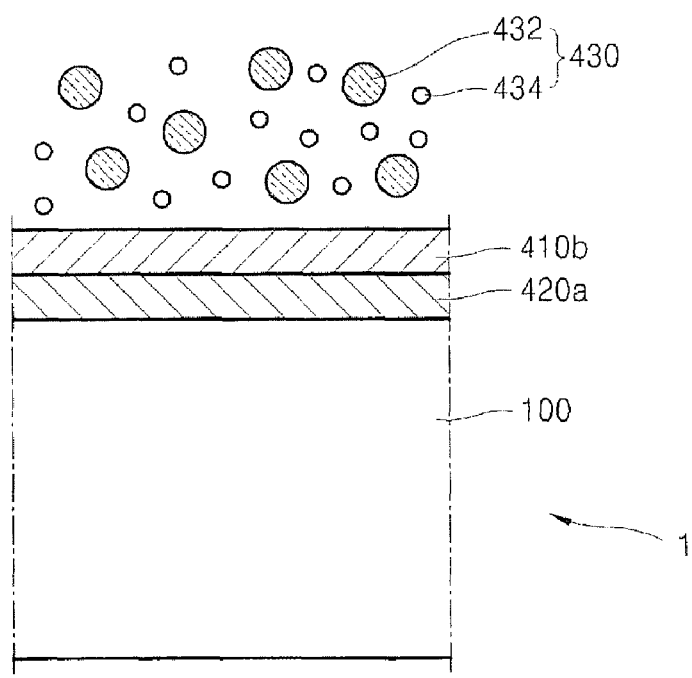
FIG. 4 is a cross-sectional view illustrating forming a first metal oxide layer on the second metal oxide layer, according to an embodiment of the inventive concept.

FIG. 4 is a cross-sectional view illustrating forming a first metal oxide layer 410b on the second metal oxide layer 420a, according to an embodiment of the inventive concept.

Referring to FIG. 4, the first metal oxide layer 410b is formed on the second metal oxide layer 420a using the method described with reference to FIG. 2. That is, a first reaction source 430 that includes a metal oxide layer precursor 432 and a first oxidizing agent 434 may be injected to form the first metal oxide layer 410b by the reaction of the metal oxide layer precursor 432 and the first oxidizing agent 434.

The first metal oxide layer 410b may be an oxide of hafnium (Hf), zirconium (Zr), tantalum (Ta), titanium (Ti), or aluminum (Al), or oxides of lanthanide (Ln). Examples of the lanthanides are lanthanum (La), cerium (Ce), praseodym (Pr), neodymium (Nd), samarium (Sm), europium (Eu), gadolinium (Gd), terbium (Tb), dysprosium (Dy), holmium (Ho), erbium (Er), tolium (Tm), ytterbium (Yb) or luthetium (Lu).

For example, the first metal oxide layer 410b may be an aluminum oxide layer, alumina ($Al_2O_3$), and in this case, the metal oxide layer precursor 432 may be aluminum tri-chloride ($AlCl_3$), however the metal oxide layer precursor 432 is not limited thereto. The first oxidizing agent 434 may preferably have low oxidizing power. For example, the first oxidizing agent 434 may be carbon dioxide ($CO_2$), and hydrogen ($H_2$) may be used together with $CO_2$, however the first oxidizing agent 434 is not limited thereto.

The first metal oxide layer 410b may preferably be formed at a high temperature at which the first metal oxide layer 410b can be formed in a crystallized state. Differences may be present depending on the type of the first metal oxide layer 410b, the substrate 100 or the process conditions, however, for example, an aluminum oxide ($Al_2O_3$) layer may be formed in a crystallized state at a temperature of about 800° C., and a hafnium oxide ($HfO_2$) layer may be formed in a crystallized state at a temperature of about 900° C. Accordingly, the first metal oxide layer 410b may preferably be formed at a temperature of about 800 to about 1200° C.

Also, the first metal oxide layer 410b may preferably be formed thinner than a final metal oxide layer. The first metal oxide layer 410b may be formed to have a thickness of about 5 to about 50 Å.

Figure 5:
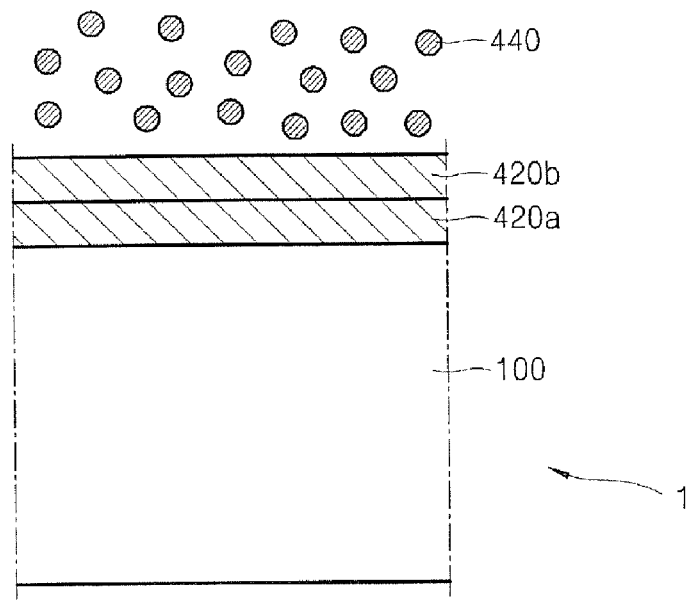
FIG. 5 is a cross-sectional view illustrating changing the first metal oxide layer to a second metal oxide layer, according to another embodiment of the inventive concept.

FIG. 5 is a cross-sectional view illustrating changing the first metal oxide layer 410b to a second metal oxide layer 420b, according to an embodiment of the inventive concept.

Referring to FIG. 5, the first metal oxide layer 410b is changed to the second metal oxide layer 420b using a second reaction source 440 including a second oxidizing agent, in the same manner described with respect to FIG. 3. The second oxidizing agent has greater oxidizing power than the first oxidizing agent 434. The second oxidizing agent may be oxygen ($O_2$), ozone ($O_3$), or water vapor ($H_2O$), however the second oxidizing agent is not limited thereto. The process of changing the first metal oxide layer 410b to the second metal oxide layer 420b may be performed at a temperature of about 800 to about 1200° C.

Figure 6:
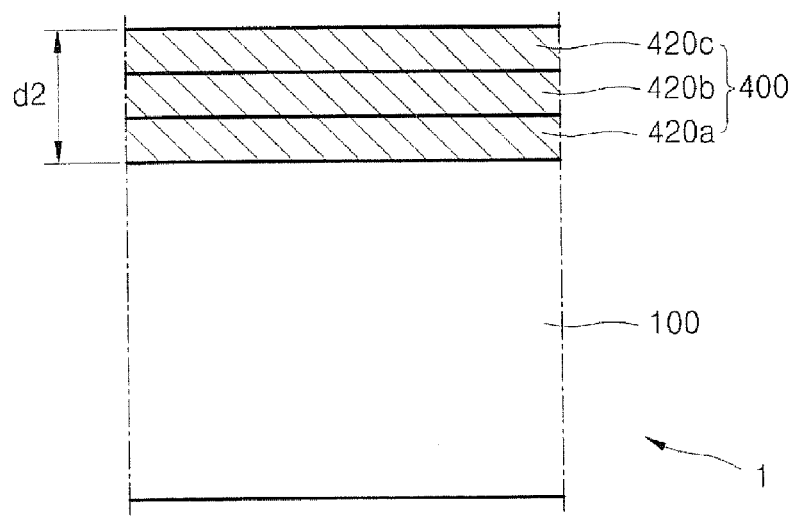
FIG. 6 is a cross-sectional view illustrating forming a metal oxide layer, according to an embodiment of the inventive concept.

FIG. 6 is a cross-sectional view illustrating a final metal oxide layer 400, formed according to an embodiment of the inventive concept.

Referring to FIG. 6, the final metal oxide layer 400, formed of the second metal oxide layers 420a, 420b, and 420c, is formed repeating the process of forming the first metal layer 410c and then changing the first metal layer 410c to a second metal oxide layer 420c, as also described with reference to FIGS. 2 and 3, and FIGS. 4 and 5. In FIG. 6, the final metal oxide layer 400 is formed of three second metal oxide layers 420a, 420b, and 420c, however the present invention is not limited thereto, and thus, the frequency of repeating the method may be adjusted according to a predetermined thickness $d_2$ of the final metal oxide layer 400. The final metal oxide layer 400 may be formed to have the thickness $d_2$ of about 10 to about 200 Å.

FIG. 7 is a timing diagram showing the flow of reaction source for forming a final metal oxide layer 400, according to a modified example of the above embodiment of the inventive concept.

Referring to FIGS. 1 through 7, the final metal oxide layer 400 is formed by mounting the substrate 100 in a chamber of a semiconductor manufacturing device being used, and adjusting the flow of reaction source. First, a first reaction source 430 is injected for a first time $t_1$. As described above, the first reaction source 430 includes a metal oxide layer precursor 432 and a first oxidizing agent 434. A first metal oxide layer 410a is formed on the substrate 100 by the first reaction source 430. The first metal oxide layer 410a may be an oxide of hafnium (Hf), zirconium (Zr), tantalum (Ta), titanium (Ti), or aluminum (Al), or oxides of lanthanide (Ln). Examples of the lanthanides are lanthanum (La), cerium (Ce), praseodym (Pr), neodymium (Nd), samarium (Sm), europium (Eu), gadolinium (Gd), terbium (Tb), dysprosium (Dy), holmium (Ho), erbium (Er), tolium (Tm), ytterbium (Yb) or luthetium (Lu).

For example, the first metal oxide layer 410a may be an aluminum oxide layer, alumina ($Al_2O_3$), and in this case, the metal oxide layer precursor 432 may be aluminum tri-chloride ($AlCl_3$), however the first metal oxide layer 410a is not limited thereto. The first oxidizing agent 434 may preferably have low oxidizing power. For example, the first oxidizing agent 434 may be carbon dioxide ($CO_2$), and hydrogen ($H_2$) may be used together with $CO_2$; however, the first oxidizing agent 434 is not limited thereto. The first metal oxide layer 410a may be formed to have a thickness $d_1$ of about 5 to about 50 Å.

After the first metal oxide layer 410a is formed, the first reaction source 430 and other byproducts are purged for a second time $t_2$. Then, a second reaction source 440 is injected for a third time $t_3$. The second reaction source 440 includes a second oxidizing agent that has greater oxidizing power than the first oxidizing agent 434. The second oxidizing agent may be oxygen ($O_2$), ozone ($O_3$), or water vapor ($H_2O$), however the second oxidizing agent is not limited thereto. In this manner, the first metal oxide layer 410a may be re-oxidized and is changed to a second metal oxide layer 420a.

After the second metal oxide layer 420a is formed, the second reaction source 440 and other byproducts are purged for a fourth time $t_4$. Then, injection and purging of the first reaction source 430 and injection and purging of the second reaction source 440 may be repeated to form the final metal oxide layer 400 formed of the second metal oxide layers 420a, 420b, and 420c. The final metal oxide layer 400 may be formed to have a thickness $d_2$ of about 10 to about 200 Å.

When the final metal oxide layer 400 is formed by adjusting the flow of reaction source in the chamber, an in-situ process may be performed, and this reduces the process time and increases production. The temperature condition may vary for each of the operations of the process; however, it is convenient to perform the process at identical temperature conditions. Also, the first metal oxide layers 410a, 410b, and 410c may preferably be formed at a high temperature at which the first metal oxide layers 410a, 410b, and 410c can be formed in a crystallized state. Differences may be present depending on the types of the first metal oxide layers 410a, 410b, and 410c, the substrate 100 or the process conditions, however, for example, an aluminum oxide ($Al_2O_3$) layer may be formed in a crystallized state at a temperature of about 800° C., and a hafnium oxide ($HfO_2$) layer may be formed in a crystallized state at a temperature of about 900° C. Accordingly, the final metal oxide layer 400 may preferably be formed at a temperature of about 800 to about 1200° C.

Figure 8A:
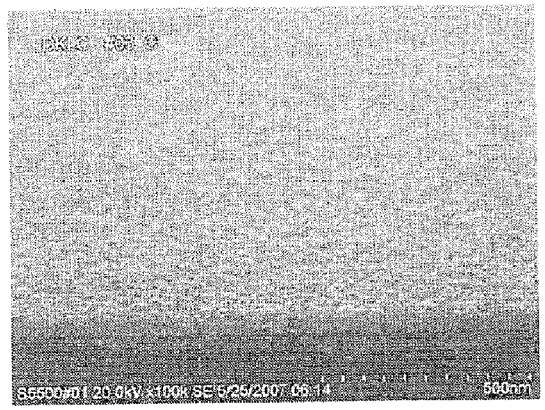
FIGS. 8A and 8B are scanning electronic microscope (SEM) photographic images of metal oxide layers formed using conventional methods for comparison.
Figure 8B:
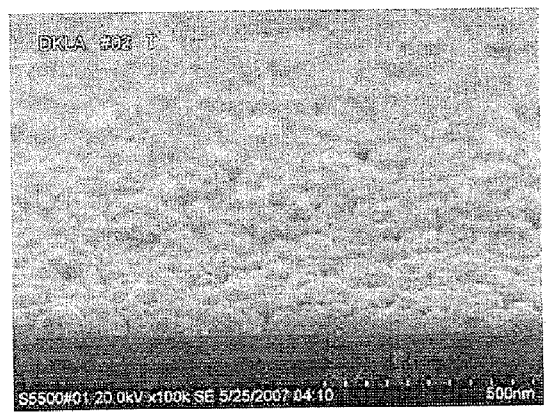
Figure 8C:
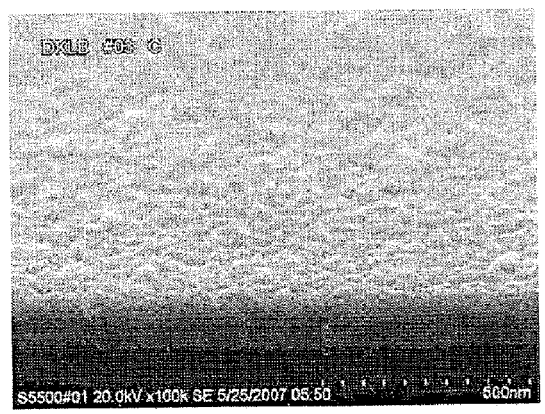
FIG. 8C is scanning electronic microscope (SEM) photographic image of the metal oxide layer according to an embodiment of the inventive concept.

FIGS. 8A and 8B are scanning electronic microscope (SEM) photographic images of metal oxide layers formed using conventional methods for comparison, and FIG. 8C is scanning electronic microscope (SEM) photographic image of the metal oxide layer according to an embodiment of the inventive concept. Regarding FIGS. 8A through 8C, an aluminum oxide layer was respectively formed at the same temperature condition of 950° C. using an aluminum tri-chloride ($AlCl_3$) as a metal oxide layer precursor. An oxidizing agent of the metal oxide layer of FIG. 8A was carbon dioxide ($CO_2$) plus hydrogen ($H_2$), an oxidizing agent of the metal oxide layer of FIG. 8B was ozone ($O_3$), and in the case of the metal oxide layer of FIG. 8C, the injection amounts of the metal oxide precursor and the oxidizing agent was varied according to the modified example of the embodiment of the inventive concept. That is, aluminum tri-chloride ($AlCl_3$), the metal oxide layer precursor, and carbon dioxide ($CO_2$) plus hydrogen ($H_2$), and the oxidizing agent were injected in the beginning, and then only ozone ($O_3$) and the oxidizing agent were injected, and this process was repeated.

Referring to FIGS. 8A through 8C, the surface roughness of the aluminum oxide layer was the least in the case of the metal oxide layer of FIG. 8A, where the oxidizing agent was carbon dioxide plus hydrogen, and the greatest in the case of the metal oxide layer of FIG. 8B, where ozone was used as the oxidizing agent. The surface roughness of the modified example of FIG. 6, which is shown in FIG. 8C, was greater than that of the one of FIG. 8A; however, smaller than that of the one of FIG. 8B. Thus the surface roughness in the case of the metal oxide layer of FIG. 8C is appropriate.

Table 1 shows the results of the oxidization amount of an underlayer that is formed during the formation of a metal oxide layer according to the type of oxidizing agents. An underlayer was a silicon (Si) substrate in all cases, and an aluminum oxide layer was formed at the same temperature condition of 950° C. by using aluminum tri-chloride ($AlCl_3$) as a metal oxide layer precursor.

TABLE 1

| | Oxidizing agent | | |
|---|---|---|---|
| | Ozone | Oxygen | Carbon dioxide + Hydrogen |
| Thickness of oxidized under layer | ~50 Å | ~20 Å | <4 Å |

Referring to Table 1, when ozone ($O_3$) or oxygen ($O_2$) which has a relatively high oxidizing power is used as an oxidizing agent, the underlayer is oxidized to a thickness of about 50 Å or about 20 Å. However, when carbon dioxide and hydrogen which have a relatively low oxidizing power is used as an oxidizing agent, the underlayer is oxidized to a thickness of about 4 Å or less, which is a degree difficult to measure. Accordingly, as in the current embodiment of the inventive concept, when a first metal oxide layer is formed using a first oxidizing agent having low oxidizing power and then the first metal oxide layer is re-oxidized using a second oxidizing agent having high oxidizing power to form a second metal oxide layer, a metal oxide layer can be formed, while hardly oxidizing the underlayer, by adjusting the thickness of the first metal oxide layer and the re-oxidization time of the second oxidizing agent. If the re-oxidization time of the second oxidizing agent is too long, the second oxidizing agent may be diffused through the second metal oxide layer and thus oxidize the underlayer. On the other hand, if the re-oxidization time of the second oxidizing agent is too short, the second oxidizing agent may not sufficiently re-oxidize the first metal oxide layer. Thus, by adjusting the re-oxidization time of the second oxidizing agent, while taking the thickness of the formed first metal oxide layer into account, oxidization of the underlayer by the second oxidizing agent, which has high oxidizing power, may be almost prevented.

Table 2 shows thickness distributions of the final metal oxide layer 400 of FIG. 7 and the final metal oxide layer 400 of FIG. 6, which are formed using the same oxidizing agent for comparison. Also, an aluminum oxide layer was formed at the same temperature condition of 950° C. by using aluminum tri-chloride ($AlCl_3$) as the metal oxide layer precursor. The thickness distribution of the aluminum oxide layer was measured on a 12-inch silicon wafer.

TABLE 2

| | Oxidizing agent | | |
|---|---|---|---|
| | Ozone | Inventive concept | Carbon dioxide + Hydrogen |
| Thickness Distribution | >60% | ~7% | ~5% |

Referring to Table 2, the thickness distribution of the aluminum oxide layer formed using an oxidizing agent ($O_3$) having large oxidization power measured on the wafer was too large. Thus it is difficult to apply the aluminum oxide layer to the actual manufacture of a semiconductor device. In contrast, the thickness distribution of the metal oxide layer, which formed according to an embodiment of the inventive concept, is not largely different from that of the aluminum oxide layer formed using an oxidizing agent, $CO_2$ plus $H_2$, which has low oxidizing power. The aluminum oxide layer, which is formed according to an embodiment of the inventive concept, may be formed by forming a first aluminum oxide layer using carbon dioxide ($CO_2$) plus hydrogen ($H_2$) as a first oxidizing agent and re-oxidizing the first aluminum oxide layer using ozone ($O_3$) as a second oxidizing agent to change the first aluminum oxide layer to a second aluminum oxide layer, and repeating these operations. The aluminum oxide layer may be formed by the first oxidizing agent, and thus the thickness distribution of the aluminum oxide layer is nearly the same as that of the first aluminum oxide layer formed using the first oxidizing agent.

Figure 9:
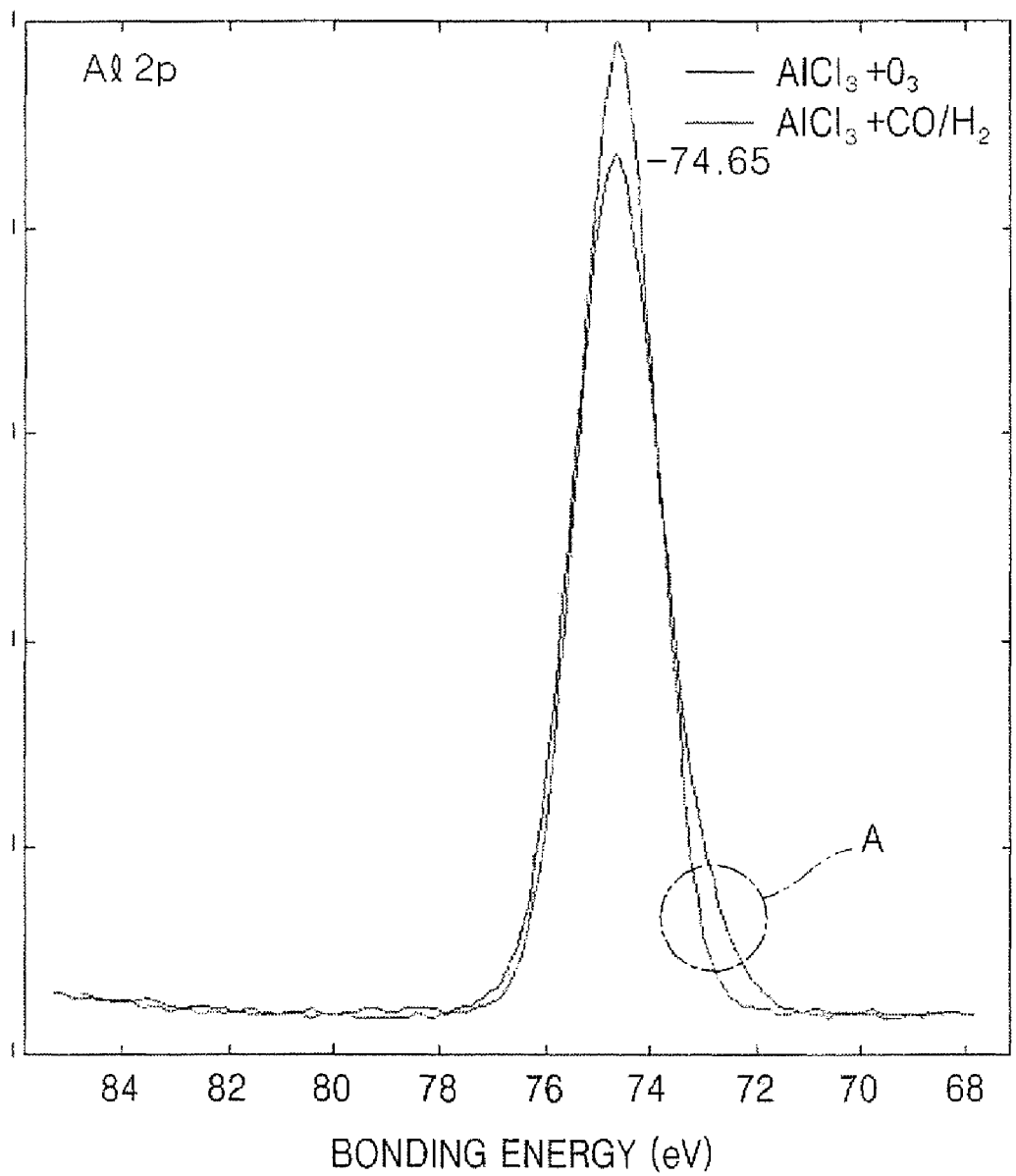
FIG. 9 is a graph illustrating an X-ray photoelectron spectroscopy (XPS) analysis result of an aluminum oxide layer, which is a metal oxide layer, according to the type of oxidizing agents.

FIG. 9 is a graph illustrating an X-ray photoelectron spectroscopy (XPS) analysis result of an aluminum oxide layer, which is a metal oxide layer, according to the type of oxidizing agents.

Referring to FIG. 9, the aluminum oxide layer, formed using an oxidizing agent having low oxidizing power, $CO_2$/$H_2$, exhibits metal properties as shown by a circle A, unlike the aluminum oxide layer formed using an oxidizing agent having high oxidizing power, $O_3$. Accordingly, a metal oxide layer formed using an oxidizing agent having small oxidizing power may have a good surface roughness and thickness distribution, however poor insulating characteristics. However, a metal oxide layer formed according to the current embodiment of the inventive concept has the same insulating characteristics as that of a metal oxide layer formed using an oxidizing agent having high oxidizing power by re-oxidization. Thus, as described above, the metal oxide layer according to the inventive concept may have a relatively good surface roughness and insulating characteristics, with a minimized oxidization degree of an underlayer during the formation of the metal oxide layer.

FIGS. 10 through 14 are cross-sectional views illustrating a method of manufacturing a semiconductor device 2, according to another embodiment of the inventive concept, wherein a metal oxide layer according to the inventive concept is applied as a blocking insulating layer of a non-volatile memory device.

Figure 10:
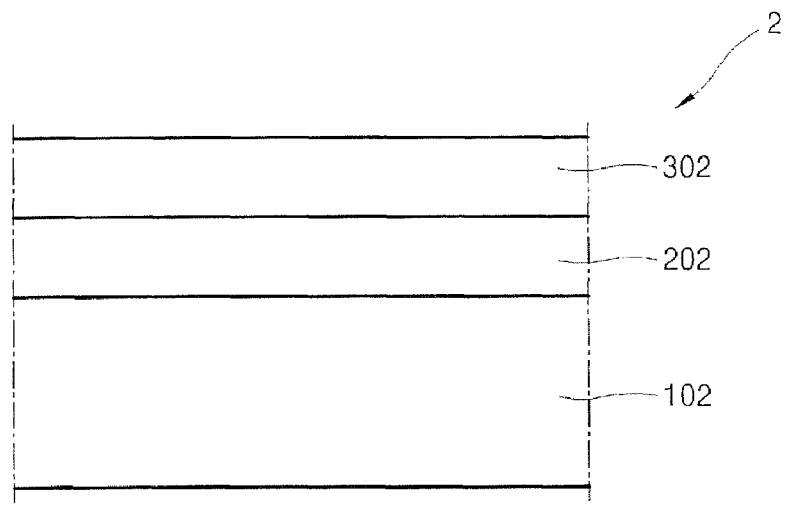
FIG. 10 is a cross-sectional view illustrating forming a charge storage layer on a substrate in which a gate insulating layer is formed, according to another embodiment of the inventive concept.

FIG. 10 is a cross-sectional view illustrating an operation of forming a charge storage layer 302 on a substrate 102 on which a gate insulating layer 202 is formed, according to another embodiment of the inventive concept.

Referring to FIG. 10, the substrate 102 may be formed of, for example, a typical semiconductor substrate, such as a silicon substrate. The substrate 102 may include unit elements (not shown) that are required for forming the semiconductor device 2, such as a transistor, and an interlayer insulating layer (not shown), covering the unit elements, may be formed on a top surface of the substrate 102. Also, conductive regions (not shown), which may be electrically connected to the unit elements via the interlayer insulating layer, may be exposed on the top surface of the substrate 102. Also, conductive lines (not shown) that connect the unit elements or the conductive regions may be included.

The gate insulating layer 202 may be formed on the substrate 102 so as to generate a tunneling effect, and may preferably have a thickness of about 20 to about 100 Å. The gate insulating layer 202 may be a silicon oxide ($SiO_2$) layer or a hafnium or zirconium oxide layer; however, the gate insulating layer 202 is not limited thereto.

The charge storage layer 302 may be formed on the gate insulating layer 202. The charge storage layer 302 may be formed to have a thickness of about 20 to about 200 Å, and may be formed as two types, largely. That is, when the charge storage layer 302 is formed of a conductor, the charge storage layer 302 may function as a floating gate. In this case, the charge storage layer 302 may include a conductor including a doped polysilicon or a metal. When the charge storage layer 302 is formed of an insulator, the charge storage layer 302 may function as a charge storage insulating layer. In this case, the charge storage layer 302 may include a nitride layer such as a silicon nitride layer, an aluminum nitride layer, or a silicon oxynitride layer.

Figure 11:
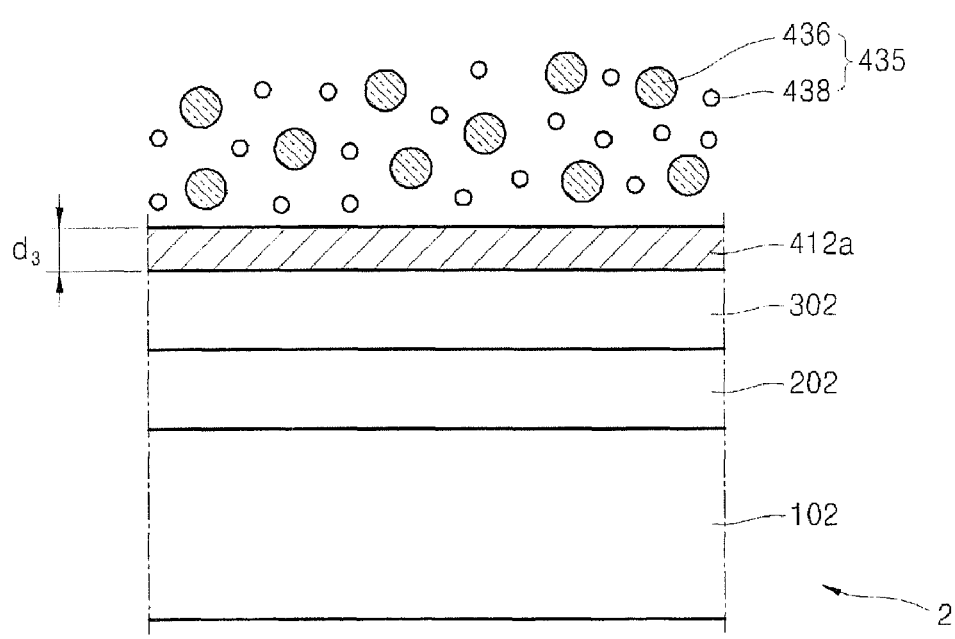
FIG. 11 is a cross-sectional view illustrating forming a first metal oxide layer according to another embodiment of the inventive concept.

FIG. 11 is a cross-sectional view illustrating forming a first metal oxide layer 412a according to another embodiment of the inventive concept.

Referring to FIG. 11, a first reaction source 435 including a metal oxide layer precursor 436 and a first oxidizing agent 438 is injected in the charge storage layer 302 to form the first metal oxide layer 412a by the reaction of the metal oxide layer precursor 436 and the first oxidizing agent 438. The first metal oxide layer 412a may be an oxide of hafnium (Hf), zirconium (Zr), tantalum (Ta), titanium (Ti), or aluminum (Al), or oxides of lanthanide (Ln). Examples of the lanthanides are lanthanum (La), cerium (Ce), praseodym (Pr), neodymium (Nd), samarium (Sm), europium (Eu), gadolinium (Gd), terbium (Tb), dysprosium (Dy), holmium (Ho), erbium (Er), tolium (Tm), ytterbium (Yb) or luthetium (Lu).

For example, the first metal oxide layer 412a may be an aluminum oxide layer, alumina ($Al_2O_3$), and in this case, the metal oxide layer precursor 436 may be aluminum tri-chloride ($AlCl_3$), however the first metal oxide layer 412a and the metal oxide layer precursor 436 are not limited thereto. The first oxidizing agent 438 may preferably have low oxidizing power. For example, the first oxidizing agent 438 may be carbon dioxide ($CO_2$), and hydrogen ($H_2$) may be used together with $CO_2$; however, the first oxidizing agent 438 is not limited thereto. When carbon dioxide ($CO_2$) and hydrogen ($H_2$) are used together, water molecules which are generated by the reaction of the carbon dioxide ($CO_2$) and hydrogen ($H_2$) function as an oxidizing agent, and but the oxidizing power in this case is smaller than when water vapor ($H_2O$) is directly used as an oxidizing agent.

The first metal oxide layer 412a may preferably be formed at a high temperature at which the first metal oxide layer 412a may be formed in a crystallized state. Differences may be present depending on the type of the first metal oxide layer 412a, the substrate 100 or the process conditions; however, for example, an aluminum oxide ($Al_2O_3$) layer may be formed in a crystallized state at a temperature of about 800° C., and a hafnium oxide ($HfO_2$) layer may be formed in a crystallized state at a temperature of about 900° C. Accordingly, the first metal oxide layer 412a may preferably be formed at a temperature of about 800 to about 1200° C.

Also, the first metal oxide layer 412a may preferably be formed thinner than a blocking insulating layer. The first metal oxide layer 412a may be formed to have a thickness $d_3$ of about 5 to about 50 Å.

Figure 12:
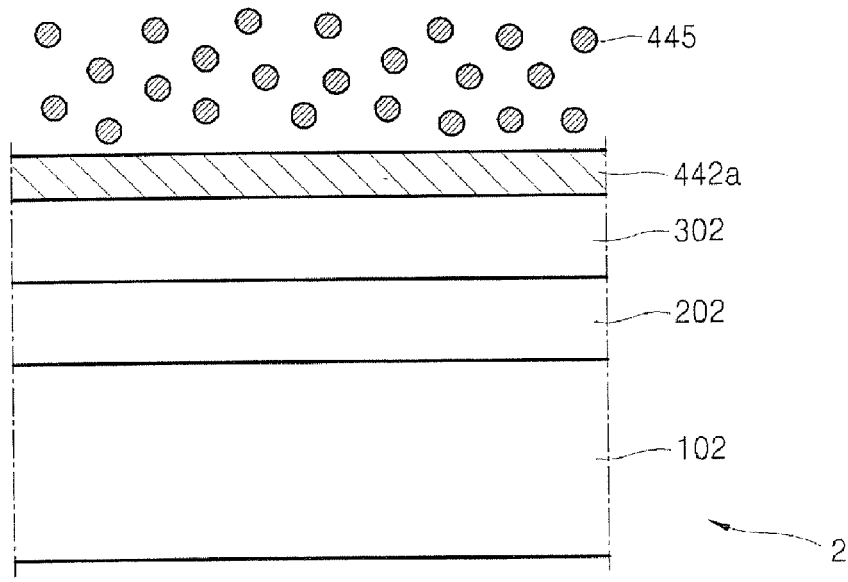
FIG. 12 is a cross-sectional view illustrating forming the first metal oxide layer of FIG. 11 to a second metal oxide layer.

FIG. 12 is a cross-sectional view illustrating forming the first metal oxide layer 412a to a second metal oxide layer 422a, according to another embodiment of the inventive concept.

Referring to FIG. 12, the first metal oxide layer 412a is changed to the second metal oxide layer 422a using a second reaction source 445 including a second oxidizing agent. The second oxidizing agent has greater oxidizing power than the first oxidizing agent 438. The second oxidizing agent may be, for example, oxygen ($O_2$), ozone ($O_3$), or water vapor ($H_2O$), however the second oxidizing agent is not limited thereto.

Since the first metal oxide layer 412a, which is formed using an oxidizing agent having low oxidizing power, is likely to partially have metal properties, the property of the first metal oxide layer 412a as an insulating layer may be decreased. Thus, when the first metal oxide layer 412a is re-oxidized using the second oxidizing agent that has greater oxidizing power than the first metal oxidizing agent 438, the metal properties of the first metal oxide layer 412a may be minimized and its property as an insulating layer may be increased.

As described above, since the first metal oxide layer 412a is changed to the second metal oxide layer 422a, the first metal oxide layer 412a may preferably be form to have a small thickness for easy re-oxidization using the second oxidizing agent. Also, in order to minimize oxidization of the substrate 100 during re-oxidization, the thickness of the first metal oxide layer 412a and the process time for changing the first metal oxide layer 412a to the second metal oxide layer 422a may preferably be adjusted.

The process of changing the first metal oxide layer 412a to the second metal oxide layer 422a may be performed at a temperature of about 800 to about 1200° C.

Figure 13:
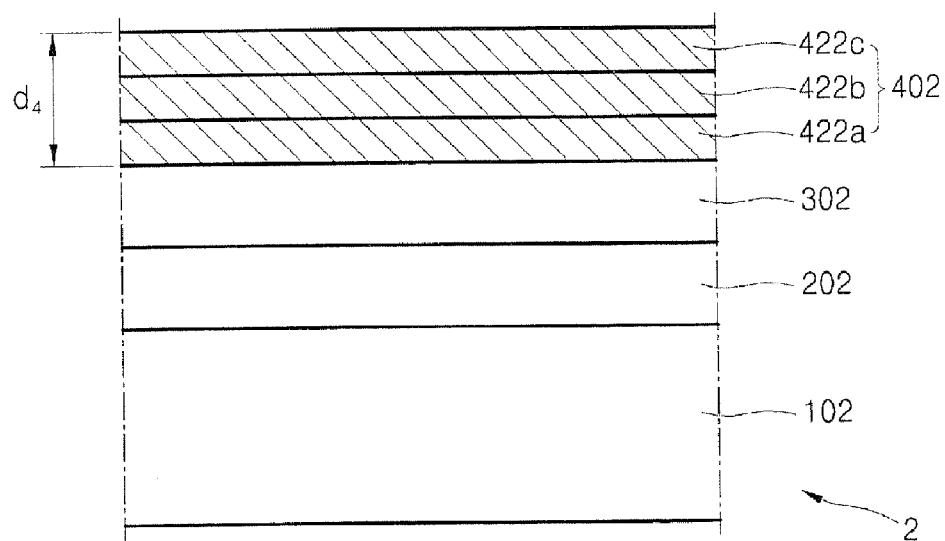
FIG. 13 is a cross-sectional view illustrating forming a blocking insulating layer according to another embodiment of the inventive concept.

FIG. 13 is a cross-sectional view illustrating forming a blocking insulating layer 402 according to another embodiment of the inventive concept.

Referring to FIG. 13, the first metal layer 412a is formed and then the first metal layer 412a is changed to the second metal oxide layer 422a, and these operations are repeated, in the same manner as described with reference to FIGS. 10 through 12, to form the blocking insulating layer 402 formed of second metal oxide layers 422a, 422b, and 422c. In FIG. 13, the blocking insulating layer 402 may be formed of three second metal oxide layers 422a, 422b, and 422c; however, the present invention is not limited thereto, and thus, the frequency of repeating the method may be adjusted according to a predetermined thickness $d_4$ of the blocking insulating layer 402. The blocking insulating layer 402 may be formed to have the thickness $d_4$ of about 50 Å to 200 Å.

Also, in the current embodiment of the inventive concept, a modification of forming the blocking insulating layer 402 involves adjusting the flow of reaction source after mounting the substrate 102 in the chamber of the semiconductor manufacturing device being used, as described with reference to FIG. 7. First, the first reaction source 435 is injected for a first time $t_1$. As described above, the first reaction source 435 includes the metal oxide layer precursor 436 and the first oxidizing agent 438. The first metal oxide layer 412a may be formed on the substrate 102 by the first reaction source 435. The first metal oxide layer 412a may be an oxide of hafnium (Hf, zirconium (Zr), tantalum (Ta), titanium (Ti), or aluminum (Al), or oxides of lanthanide (Ln). Examples of the lanthanides are lanthanum (La), cerium (Ce), praseodym (Pr), neodymium (Nd), samarium (Sm), europium (Eu), gadolinium (Gd), terbium (Tb), dysprosium (Dy), holmium (Ho), erbium (Er), tolium (Tm), ytterbium (Yb) or luthetium (Lu).

For example, the first metal oxide layer 412a may be an aluminum oxide layer, alumina ($Al_2O_3$), and in this case, the metal oxide layer precursor 436 may be aluminum tri-chloride ($AlCl_3$); however, the first metal oxide layer 412a is not limited thereto. The first oxidizing agent 438 may have low oxidizing power. For example, the first oxidizing agent 438 may be carbon dioxide ($CO_2$), and hydrogen ($H_2$) may be used together with $CO_2$; however, the first oxidizing agent 438 is not limited thereto. The first metal oxide layer 412a may be formed to have a thickness $d_3$ of about 5 to about 50 Å.

After the first metal oxide layer 412a is formed, the first reaction source 435 and other byproducts are purged for a second time $t_2$. Then, the second reaction source 445 is injected for a third time $t_3$. The second reaction source 445 may include a second oxidizing agent that has greater oxidizing power than the first oxidizing agent 438. The second oxidizing agent may be oxygen ($O_2$), ozone ($O_3$), or water vapor ($H_2O$); however, the second oxidizing agent is not limited thereto. In this manner, the first metal oxide layer 412a may be re-oxidized and may be changed to the second metal oxide layer 422a.

After the second metal oxide layer 422a is formed, a second reaction source 440 and other byproducts are purged for a fourth time $t_4$. Then, injection and purging of the first reaction source 430 and injection and purging of the second reaction source 440 are repeated to form the blocking insulating layer 402 formed of second metal oxide layers 422a, 422b, and 422c. The blocking insulating layer 402 may be formed to have a thickness $d_4$ of about 50 to about 200 Å.

When the blocking insulating layer 402 is formed by adjusting the flow of reaction source in the chamber, an in-situ process can be performed, and this reduces the process time and increases production. The temperature condition may vary for each operation of the process, however it is convenient to perform the process at identical temperature conditions. Also, the first metal oxide layer 412a may preferably be formed at a high temperature at which the first metal oxide layer 412a may be formed in a crystallized state. Differences may be present depending on the type of the blocking insulating layer 402, the substrate 102 or the process conditions, and the blocking insulating layer 402 may preferably be formed at a temperature of about 800 to about 1200° C.

Figure 14:
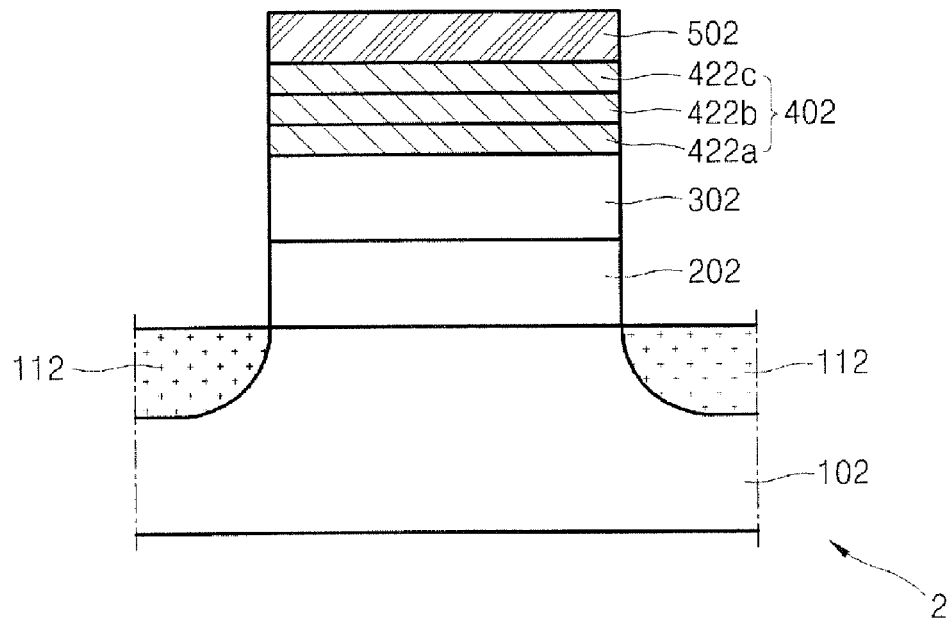
FIG. 14 is a cross-sectional view illustrating forming an electrode layer and an impurity region, according to another embodiment of the inventive concept.

FIG. 14 is a cross-sectional view illustrating forming an electrode layer 502 and an impurity region 112, according to another embodiment of the inventive concept.

Referring to FIG. 14, the electrode layer 502 is formed on the blocking insulating layer 402, and the impurity region 112 is formed at both ends of the substrate 102 on which the gate insulating layer 202, the charge storage layer 302, and the blocking insulating layer 402 are formed, and thus, an individual non-volatile memory device may be formed. As described above, when the charge storage layer 302 is formed of a conductor, a classical flash memory, which is a floating gate type non-volatile memory device, may be formed. On the other hand, when the charge storage layer 302 is an insulator, a charge trap type flash memory, which is a floating trap type non-volatile memory device, can be formed. The structure of the individual non-volatile memory device is a basic structure and is aimed at showing the contact between individual elements, however the structure of the individual non-volatile memory device is not limited thereto. A channel region (not shown) which is formed at a contact surface of the substrate 102 to the gate insulating layer 202 may be a flat panel structure as illustrated in FIG. 14. The channel region may also have a modified structure for extending the length of the channel such as a recessed structure or a protruded structure, and the shape of the substrate 102, the gate insulating layer 202, the charge storage layer 302, and the blocking insulating layer 402 may be varied accordingly.

Figure 15:
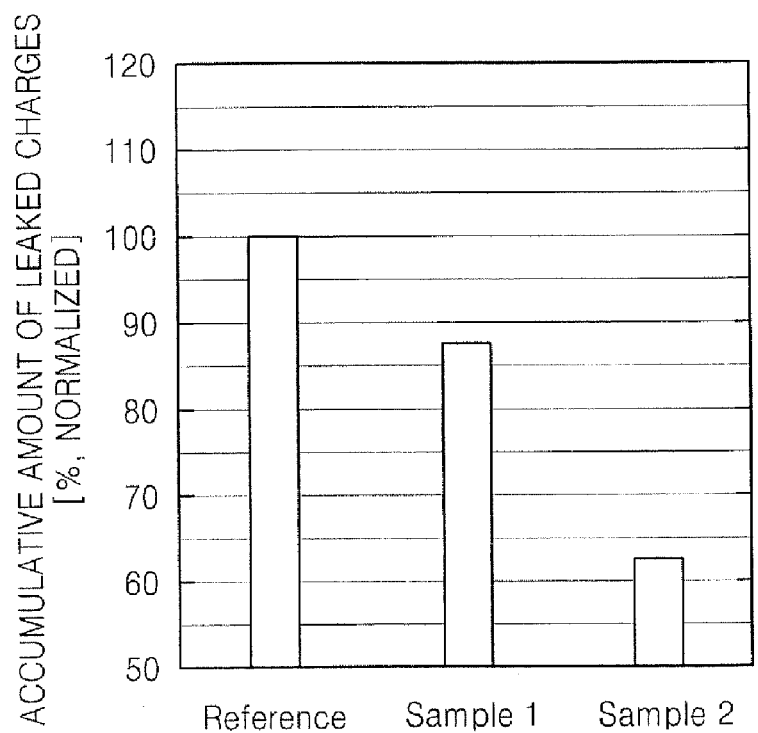
FIG. 15 is a graph illustrating leakage charge amounts through a blocking insulating layer, according to an embodiment of the inventive concept, a blocking insulating layer formed using a crystallized insulating layer, and a blocking insulating layer formed using an amorphous insulating layer.

FIG. 15 is a graph illustrating the amount of leaked charges through a blocking insulating layer, according to an embodiment of the inventive concept, and blocking insulating layers formed using a crystallized insulating layer or an amorphous insulating layer. Referring to FIG. 15, the leakage amount of charges stored in the charge storage layer to an electrode layer is measured accumulatively under high temperature stress (HTS) according to the type of insulating layers used as a blocking insulating layer. When the leakage amount of charges from the charge storage layer to the electrode layer in the case where the blocking insulating layer is formed of an amorphous aluminum oxide layer (Reference) is regarded as 100%, and the leakage amount of charges from the charge storage layer to the electrode layer in the case where the blocking insulating layer is formed using a crystallized aluminum oxide layer (Sample 1) was about 85%, which is about a 15% improved charge preservation capability.

Also, when the blocking insulating layer is formed using an aluminum oxide layer formed by repeating forming a first metal oxide layer and changing the first metal oxide layer to a second metal oxide layer several times, according to the above-described embodiment of the inventive concept (Sample 2), the leakage amount of charges from the charge storage layer to the electrode layer was about 65%, which is a 25% improved charge preservation capability than that of Reference where the blocking insulating layer was formed using a crystallized aluminum oxide layer.

Figure 16:
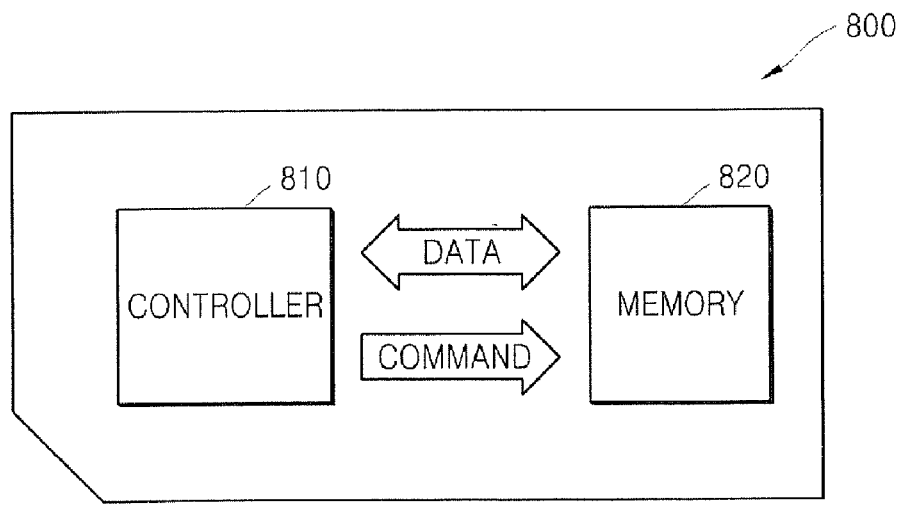
FIG. 16 is a schematic view illustrating a card according to an embodiment of the inventive concept.

FIG. 16 is a schematic view illustrating a card 800 according to an embodiment of the inventive concept. Referring to FIG. 16, a controller 810 and a memory 820 may be arranged to exchange electrical signals. For example, according to a command of the controller 810, the memory 820 and the controller 810 may transmit/receive data to/from each other. Accordingly, the card 800 may store data to the memory 820 or externally output data from the memory 820.

The memory 820 may include a memory device such as the semiconductor device 1 and 2 described with reference to FIGS. 1, 4 through 13, and 18 through 21. The type of memory device used herein is not limited thereto, and may include a DRAM, an SRAM, a flash memory, a phase change RAM (PRAM), and so forth.

The card 800 may be used in various portable electronic devices such as a multi media card (MMC) or a secure digital card (SD).

Figure 17:
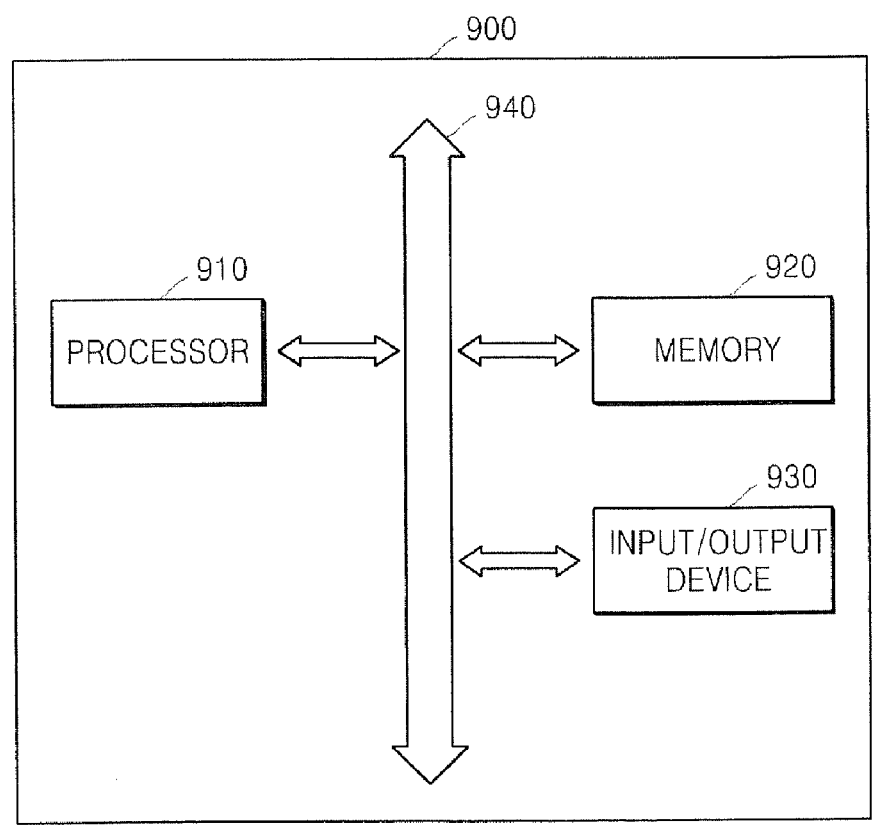
FIG. 17 is a block diagram illustrating a system according to an embodiment of the inventive concept.

FIG. 17 is a block diagram illustrating a system 900 according to an embodiment of the inventive concept.

Referring to FIG. 17, a processor 910, an input/output device 930, and a memory 920 may conduct data communication to one another using a bus 940. The processor 910 may execute a program and control the system 900. The input/output device 930 may be used to input or output data of the system 900. The system 900 may be connected to an external device such as a personal computer or a network via the input/output device 930, and exchange data with the external device.

The memory 920 may store codes for operating the processor 910 or may store data. The memory 920 may include a memory device such as the semiconductor device 1 and 2 described with reference to FIGS. 1 through 6, and 10 through 14. The type of memory device used herein is not limited thereto, and may include a DRAM, an SRAM, a flash memory, a phase change RAM (PRAM), and so forth.

For example, the system 900 may be used in various portable electronic devices such as a mobile phone, an MP3 player, a navigation device, a solid state disk (SSD), or household appliances.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
   forming a first metal oxide layer on a substrate in a chamber using a first reaction source comprising a metal oxide layer precursor and a first oxidizing agent comprising carbon dioxide ($CO_2$), and changing the first metal oxide layer to a second metal oxide layer using a second reaction source comprising a second oxidizing agent having larger oxidizing power than the first oxidizing agent and repeating the forming of the first metal oxide layer and the changing of the first metal oxide layer to the second metal oxide layer several times to form a blocking insulating layer; and
   purging one of the first and second reaction sources after supplying one of the first and second reaction sources, said purging occurring before supplying the other subsequent first and second reaction sources.

2. The method of claim 1, wherein the second oxidizing agent comprises one of oxygen ($O_2$), ozone ($O_3$), and water vapor ($H_2O$).

3. The method of claim 1, wherein the first metal oxide layer is formed to have a thickness of about 5 to about 50 Å as the first reaction source is supplied for one time for a predetermined time.

4. The method of claim 1, wherein the blocking insulating layer comprises an oxide of hafnium (Hf), zirconium (Zr), tantalum (Ta), titanium (Ti), aluminum (Al), or lanthanide (Ln).

* * * * *